United States Patent
Guziak

(10) Patent No.: US 11,271,386 B2
(45) Date of Patent: Mar. 8, 2022

(54) ELECTRONIC TEMPERATURE SWITCH

(71) Applicant: HYDRA-ELECTRIC COMPANY, Burbank, CA (US)

(72) Inventor: Robert Andrew Guziak, Thousand Oaks, CA (US)

(73) Assignee: HYDRA-ELECTRIC COMPANY, Burbank, CA (US)

( * ) Notice: Subject to any disclaimer, the term of this patent is extended or adjusted under 35 U.S.C. 154(b) by 0 days.

(21) Appl. No.: 17/113,300

(22) Filed: Dec. 7, 2020

(65) Prior Publication Data

US 2021/0119439 A1 Apr. 22, 2021

Related U.S. Application Data

(63) Continuation-in-part of application No. 15/931,222, filed on May 13, 2020, which is a continuation of
(Continued)

(51) Int. Cl.

| | |
|---|---|
| H02H 5/04 | (2006.01) |
| G05B 1/01 | (2006.01) |
| G05D 23/30 | (2006.01) |
| H01H 37/32 | (2006.01) |
| H02H 3/20 | (2006.01) |
| G08B 21/18 | (2006.01) |
| G01R 19/165 | (2006.01) |

(52) U.S. Cl.
CPC ............... *H02H 5/047* (2013.01); *G05B 1/01* (2013.01); *G05D 23/306* (2013.01);
(Continued)

(58) Field of Classification Search
CPC .......... H02H 5/047; H02H 3/207; G05B 1/01; G05D 23/306; G08B 21/182; H01H 37/32; G01R 19/165

(Continued)

(56) References Cited

U.S. PATENT DOCUMENTS

| | | |
|---|---|---|
| 4,282,718 A | 8/1981 | Kountz et al. |
| 6,512,444 B1 | 1/2003 | Morris et al. |

(Continued)

FOREIGN PATENT DOCUMENTS

| | | |
|---|---|---|
| GB | 2165649 A | 4/1986 |
| WO | 8901132 A1 | 2/1989 |

OTHER PUBLICATIONS

Cook, Forrest G., 12 volt differential temperature controller, 2008.
(Continued)

*Primary Examiner* — Dharti H Patel
(74) *Attorney, Agent, or Firm* — Concept IP LLP; Michael Zarrabian

(57) ABSTRACT

A Micro Electro-Mechanical System (MEMS) device comprises an evaluator circuit that receives a temperature signal, where the evaluator circuit compares the received temperature signal to a lower threshold value and an upper threshold value, and where the evaluator circuit generates an evaluation signal indicating when the temperature signal is between the lower threshold value and the upper threshold value; and a loading circuit that receives the evaluation signal, where the loading circuit generates a first pre-set output signal indicating when the temperature signal is between the lower threshold value and the upper threshold value, and wherein the loading circuit generates a second pre-set output signal when the temperature signal is not between the lower threshold value and the upper threshold value, such that the MEMS device functions as a 2-wire electronic sense circuit providing both an indication state and deriving power from an external two-wire sense circuit.

16 Claims, 8 Drawing Sheets

Related U.S. Application Data application No. 15/580,099, filed as application No. PCT/US2016/036477 on Jun. 8, 2016, now Pat. No. 10,693,290.

(60) Provisional application No. 62/173,287, filed on Jun. 9, 2015.

(52) U.S. Cl.
CPC .......... G08B 21/182 (2013.01); H01H 37/32 (2013.01); H02H 3/207 (2013.01); *G01R 19/165* (2013.01)

(58) Field of Classification Search
USPC ........................................................ 361/103
See application file for complete search history.

(56) References Cited

U.S. PATENT DOCUMENTS

2004/0008460 A1* 1/2004 Engel .................. H02H 1/0015
361/42

2014/0230540 A1 8/2014 Gölzhäuser et al.
2014/0230543 A1 8/2014 Fritz et al.

OTHER PUBLICATIONS

Cook, G. Forrest. 12 volt differential temperature controller. Jan. 8, 2012 (Jan. 8, 2012) [retrieved on Aug. 2, 2016]. Retrieved from the Internet: <URL: http://www.solorb.com/elect/solarcirc/diftemp2/>. entire document.

ECircuit Center. BJT Differential Amplifier. Dec. 17, 2014 (Dec. 17, 2014) [retrieved on: Aug. 2, 2016] Retrieved from the Internet: <URL: http://www.ecircuitcenter.com/Circuits/BJT_Diffamp1/BJT_Diffamp1.htm>. entire document.

Learning Bout Electronics. Jun. 25, 2013 (Jun. 25, 2013) [retrieved on Aug. 2, 2016]. Retrieved from the Internet: <URL: https://web.archive.org/web20130625075829/http://www.learningaboutelectronics.com/Articles/Diode-resistance/php>. entire document.

Texas Intruments. LM324—Quadruple Operational Amplifier. Feb. 27, 2015 (Feb. 27, 2015) [retrieved on Aug. 2, 2016]. Retrieved from the Internet: <URL: http://www.ti.com/product/lm324>. entire document.

\* cited by examiner

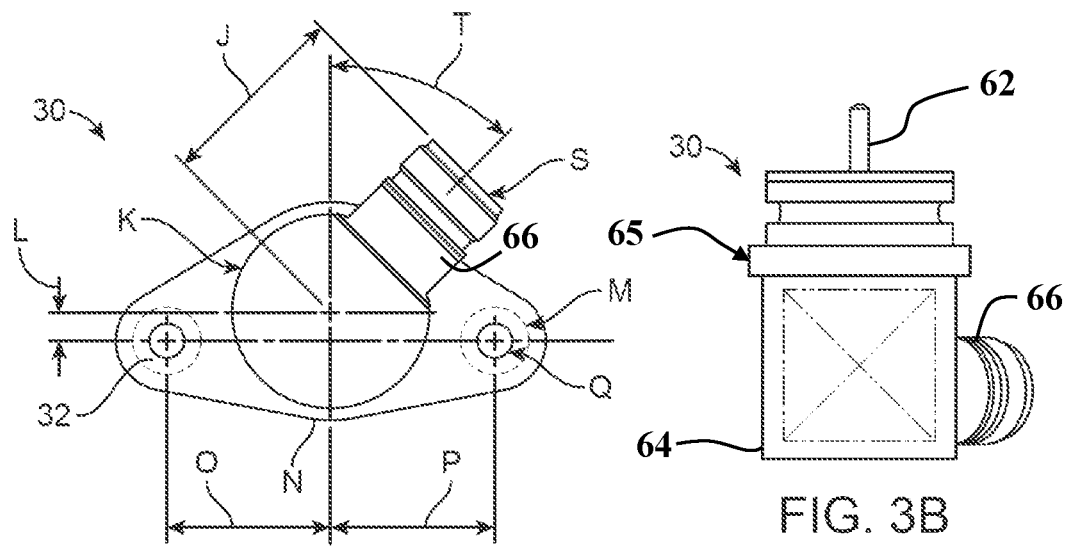
FIG. 3A
FIG. 3B
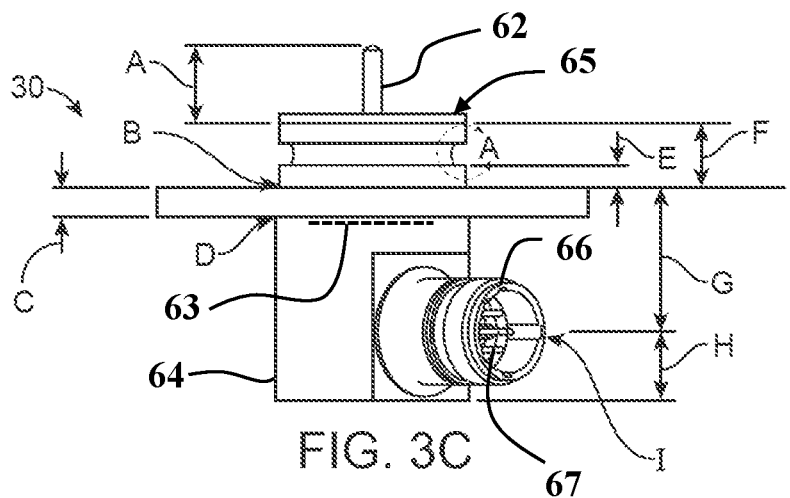
FIG. 3C
FIG. 3D
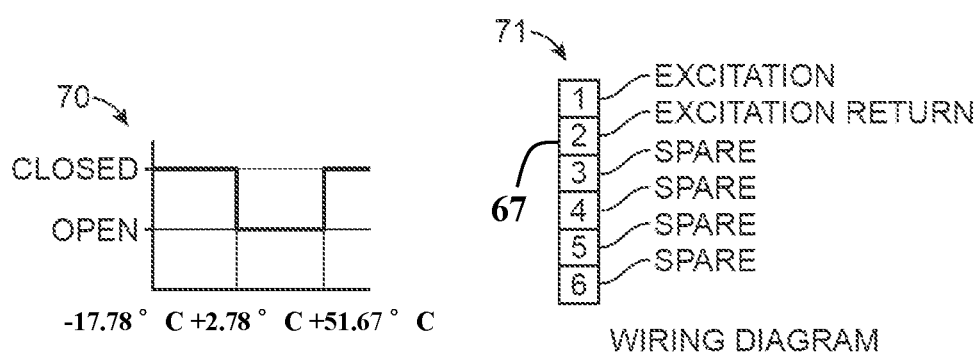
FIG. 4A
FIG. 4B

DETAIL A

ELECTRONIC TEMPERATURE SWITCH

CROSS-REFERENCE TO RELATED APPLICATIONS

This application is a continuation-in-part of U.S. Non-Provisional patent application Ser. No. 15/931,222, filed May 13, 2020, which is a continuation of U.S. Non-Provisional patent application Ser. No. 15/580,099, filed Dec. 6, 2017, which issued as U.S. Pat. No. 10,693,290 on Jun. 23, 2020, which is a U.S. National Phase Patent Application under 35 U.S.C. § 371 of International Application Number PCT/US2016/036477, filed Jun. 8, 2016, which claims the priority benefit of U.S. Provisional Patent Application Ser. No. 62/173,287, filed Jun. 9, 2015, all of which are incorporated herein by reference in their entirety for all purposes.

TECHNICAL FIELD

The present disclosure relates to electronic switches, and more particularly to electronic temperature switches.

BACKGROUND

In conventional mechanical temperature switch designs, a temperature sensing element senses rise or drop in temperature, which results in the increase and decrease of internal pressure of liquid or gas such as in liquid filled temperature switches. This variation in pressure then mechanically actuates a mechanical switch. Mechanical temperature switches are susceptible to shock, vibration, acoustic noises, etc. Further, the size of conventional mechanical temperature switches limits their application.

SUMMARY

An electronic temperature switch embodiment may include: a measurement circuit that measures temperature and generates a temperature signal corresponding to the sensed temperature; and an evaluator circuit that receives said temperature signal and compares said temperature signal to a lower threshold value and an upper threshold value, and generates an evaluation signal indicating when said temperature signal is between the lower temperature threshold value and a higher temperature threshold value.

In additional electronic temperature switch embodiments, the evaluator circuit may have an evaluation circuit ratio independent of power supply voltage. In additional electronic temperature switch embodiments, the measurement circuit may comprise an enhancement circuit that enhances signal-to-noise-ratio of the temperature signal for input to the evaluator circuit. In additional electronic temperature switch embodiments, the switch may derive essentially all operating power from a 2-wire sense circuit. In additional electronic temperature switch embodiments, the electronic temperature switch may comprise a 2-wire device powered by a power supply with a series resistance, where the evaluation signal indication is at the junction of the series resistor and the power supply input. In additional electronic temperature switch embodiments, the measurement circuit may comprise a temperature sensor with variable resistance based on temperature.

In additional electronic temperature switch embodiments, the temperature sensor may comprise a resistive element with variable resistance based on temperature. In additional electronic temperature switch embodiments, the evaluator circuit may comprise a window comparator circuit configured for: comparing the temperature signal to a lower reference value corresponding to the lower temperature threshold value; and comparing the temperature signal to a higher reference value corresponding to the higher temperature threshold value; where the window comparator indicates when said temperature signal is between the lower temperature threshold value and a higher temperature threshold value. In additional electronic temperature switch embodiments, the comparator circuit window may be adjustable between about ½° and 6°. In additional electronic temperature switch embodiments, the window comparator circuit may comprise: a first comparator for comparing the temperature signal to the lower reference value corresponding to the lower temperature threshold value, and a second comparator for comparing the temperature signal to the higher reference value corresponding to the higher temperature threshold value.

In additional electronic temperature switch embodiments, comparator hysteresis may be reduced by amplifying the generated temperature signal via an operational amplifier to improve a signal to noise ratio of the generated temperature signal. In an integrated Micro Electro-Mechanical System (MEMS) device embodiment, comparator hysteresis may be reduced by amplifying the generated temperature signal via an amplifier to improve a signal to noise ratio of the generated temperature signal. Additional electronic temperature switch embodiments may include: a loading circuit that in response to the evaluator circuit, generates a first pre-set output signal indicating when the temperature signal is between the lower threshold value and the higher threshold value, and a second pre-set output signal when the temperature signal is not between the lower threshold value and the higher threshold value. Additional electronic temperature switch embodiments may include a protection circuit that provides over-voltage protection.

An electronic temperature switch device embodiment may include: an electronic temperature switch circuit; a temperature sensor; and a housing for housing the electronic temperature switch circuit and at least a portion of the temperature sensor; where the electronic temperature switch circuit, includes: a measurement circuit that measures temperature and generates a temperature signal corresponding to the sensed temperature; and an evaluator circuit that receives said temperature signal, compares said temperature signal to a lower threshold value and an upper threshold value, and generates an evaluation signal indicating when said temperature signal is between the lower temperature threshold value and a higher temperature threshold value.

In additional electronic temperature switch device embodiments, the evaluator circuit may have an evaluation circuit ratio independent of power supply voltage. In additional electronic temperature switch device embodiments, the measurement circuit may comprise an enhancement circuit that enhances signal-to-noise-ratio of the temperature signal for input to the evaluator circuit. In additional electronic temperature switch device embodiments, the circuit may derive essentially all operating power from a 2-wire sense circuit. In additional electronic temperature switch device embodiments, the circuit may further include: a loading circuit that in response to the evaluator circuit, generates a first pre-set output signal indicating when the temperature signal is between the lower threshold value and the higher threshold value, and a second pre-set output signal when the temperature signal is not between the lower threshold value and the higher threshold value. In additional electronic temperature switch device embodiments, the housing may have dimensions of about 1.25 cm by 4.5 cm.

In an integrated MEMS device electronic temperature switch embodiment, the dimensions may be about 3 mm by 5 mm. In another integrated MEMS device embodiment, the device may be mounted completely in a thermowell type enclosure that surrounds the integrated MEMS device.

An electronic temperature switch device embodiment may include: an electronic temperature switch circuit; a temperature sensor; and a housing for housing the electronic temperature switch circuit and at least a portion of the temperature sensor; where the electronic temperature switch circuit, includes: a measurement circuit that measures temperature and generates a temperature signal corresponding to the sensed temperature; an evaluator circuit that that receives said temperature signal compares said temperature signal to a lower threshold value and an upper threshold value, and generates an evaluation signal indicating when said temperature signal is between the lower temperature threshold value and an higher temperature threshold value; and a loading circuit that in response to the evaluator circuit, generates a first pre-set output signal indicating when the temperature signal is between the lower threshold value and the higher threshold value, and a second pre-set output signal when the temperature signal is not between the lower threshold value and the higher threshold value; and where the evaluator circuit has an evaluation circuit ratio independent of power supply voltage, the measurement circuit enhances signal-to-noise-ratio of the temperature signal for input to the evaluator circuit, and the electronic temperature switch circuit derives essentially all operating power from a 2-wire sense circuit.

In one embodiment, an integrated MEMS device electronic temperature switch device may contain all of the electronics along with an integrated temperature sensing element. The integrated temperature sensing element may be an integrated resistance temperature detector (RTD), a silicon junction temperature monitor or a bi-metal fabricated thermocouple, in some embodiments. The Integrated MEMS may be contained in a secondary housing ranging in size from a volume that just contains the MEMS device or one that has additional structure to fit into a specific application.

A MEMS device embodiment of the electronic temperature switch disclosed herein may include: an evaluator circuit that receives a temperature signal, where the evaluator circuit compares the received temperature signal to a lower threshold value and an upper threshold value, and where the evaluator circuit generates an evaluation signal indicating when the temperature signal is between the lower threshold value and the upper threshold value; and a loading circuit that receives the evaluation signal, where the loading circuit generates a first pre-set output signal indicating when the temperature signal is between the lower threshold value and the upper threshold value, and where the loading circuit generates a second pre-set output signal when the temperature signal is not between the lower threshold value and the upper threshold value, such that the MEMS device temperature switch functions as a 2-wire electronic sense circuit providing both an indication state and deriving power from an external two-wire sense circuit.

Additional MEMS device electronic temperature switch embodiments may include: an electronic temperature switch; and a pair of wire bond pads; where the electronic loading switch is turned on to couple the first pre-set output signal across the pair of wire bond pads when the temperature signal is between the lower threshold value and the upper threshold value; and where the electronic loading switch is turned off to couple the second pre-set output signal across the pair of wire bond pads when the temperature signal is either below the lower threshold value or above the upper threshold value. In additional MEMS device embodiments, the electronic temperature switch is disposed on a single chip integrated in the MEMS device, and where the electronic temperature switch is connected to the pair of wire bond pads via corresponding wires.

In additional MEMS device electronic temperature switch embodiments, the electronic temperature switch is integrated into a MEMS substrate. Additional MEMS device embodiments may include: a temperature sensing element, where the electronic temperature switch is connected to the temperature sensing element via at least one wire. Additional MEMS device embodiments may include: a measurement circuit that measures a temperature from the temperature sensing element, where the measurement circuit generates the temperature signal corresponding to the measured temperature. Additional MEMS device embodiments may include: an enhancement circuit of the measurement circuit, where the enhancement circuit enhances a signal-to-noise ratio of the temperature signal prior to generation of the temperature signal.

Additional MEMS device electronic temperature switch embodiments may include: a connection through wire bond pads to an external two-wire sense circuit, where the electronic temperature switch derives power from the two-wire sense circuit. Additional MEMS device embodiments may include: a window comparator circuit of the evaluator circuit, where the window comparator circuit compares the temperature signal to a lower reference value corresponding to the lower temperature threshold value, and where the window comparator circuit compares the temperature signal to the higher reference value corresponding to the higher temperature threshold value, and where the window comparator circuit indicates when the temperature signal is between the lower temperature threshold value and the higher temperature threshold value.

Additional MEMS device electronic temperature switch embodiments may include: a first comparator of the window comparator circuit, where the first comparator compares the temperature signal to the lower reference value corresponding to the lower temperature threshold value. Additional MEMS device embodiments may include: a second comparator of the window comparator circuit, where the second comparator compares the temperature signal to the higher reference value corresponding to the lower temperature threshold value. Additional MEMS device embodiments may include: an amplifier of the window comparator circuit, where the amplifier improves a signal-to-noise ratio of the generated temperature signal.

In additional MEMS device electronic temperature switch embodiments, the MEMS device is incorporated within a single integrated MEMS consisting of a small form factor. In additional MEMS device embodiments, the small form factor is about 3 millimeters by 5 millimeters. Additional MEMS device embodiments may include: a protection circuit connected between the pair of wire bond pads, where the protection circuit provides over-voltage protection.

An embodiment of a method of electronic temperature measurement and switching disclosed herein may include: measuring, by a measurement circuit, a temperature from a temperature sensing element; generating, by the measurement circuit, a temperature signal corresponding to the measured temperature; receiving, by an evaluator circuit, the generated temperature signal from the measurement circuit; comparing, by the evaluator circuit, the received temperature signal to a lower threshold value and an upper threshold value; generating, by the evaluator circuit, an evaluation signal indicating when the temperature signal is between the lower threshold value and the upper threshold value; receiving, by a loading circuit, the generated evaluation signal; generating, by the loading circuit, a first pre-set output signal indicating when the temperature signal is between the lower threshold value and the upper threshold value, where the electronic loading switch is turned on to couple the first pre-set output signal across a pair of wire bond pads when the temperature signal is between the lower threshold value and the upper threshold value; and generating, by the loading circuit, a second pre-set output signal indicating when the temperature signal is not between the lower threshold value and the upper threshold value, wherein the electronic loading switch is turned off to couple the second pre-set output signal across the pair of wire bond pads when the temperature signal is either below the lower threshold value or above the upper threshold value.

This brief summary has been provided so that the nature of this disclosure may be understood quickly. A more complete understanding of the disclosure can be obtained by reference to the following detailed description of the various aspects thereof in connection with the attached drawings.

BRIEF DESCRIPTION OF THE DRAWINGS

The foregoing features and other features will now be described with reference to the drawings of various aspects. In the drawings, the same components have the same reference numerals. The illustrated aspects are intended to illustrate, but not to limit the present disclosure. The drawings include the following Figures:

FIG. 3A shows a top view of an embodiment of an assembled electronic temperature switch device employing the electronic temperature switch of FIG. 1, disclosed herein;

FIG. 3B shows a side view of the assembled electronic temperature switch device of FIG. 3A;

FIG. 3C shows a front view of the assembled electronic temperature switch device of FIG. 3A;

FIG. 3D shows a detail view about A of the assembled electronic temperature switch device of FIG. 3A;

FIG. 4A shows a graph of a closing and opening of the electronic temperature switch device at different temperatures;

FIG. 4B shows a wiring diagram of the electronic temperature switch device;

DETAILED DESCRIPTION

Figure 1:
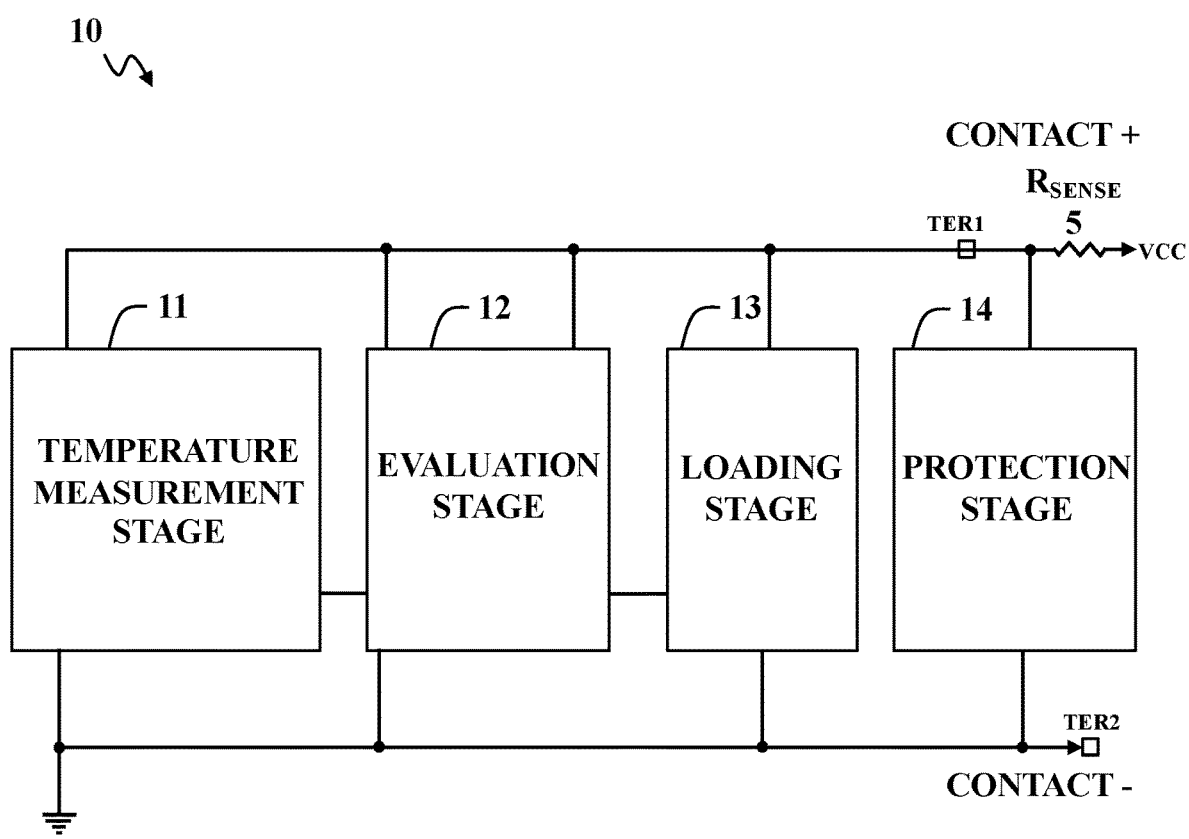
FIG. 1 shows a functional block diagram of an embodiment of an electronic temperature switch, disclosed herein.

The description herein is made for the purpose of illustrating the general principles of the embodiments discloses herein and is not meant to limit the concepts disclosed herein. Further, particular features described herein can be used in combination with other described features in each of the various possible combinations and permutations. Unless otherwise specifically defined herein, all terms are to be given their broadest possible interpretation including meanings implied from the description as well as meanings understood by those skilled in the art and/or as defined in dictionaries, treatises, etc.

Embodiments of an electronic temperature switch device comprising a temperature sensor and an electronic temperature switch circuit, are disclosed herein. In one embodiment, the electronic temperature switch device indicates when a fluid temperature falls within a fault condition range.

An electronic temperature switch 10 embodiment, comprising: a measurement circuit 11 that measures temperature and generates an temperature signal corresponding to the sensed temperature; and an evaluator circuit 12 that receives said temperature signal and compares said temperature signal to a lower threshold value and an upper threshold value, and generates an evaluation signal indicating when said temperature signal is between the lower temperature threshold value and an higher temperature threshold value.

In additional electronic temperature switch embodiments, the evaluator circuit has an evaluation circuit ratio independent of power supply voltage. In additional electronic temperature switch embodiments, the measurement circuit comprises an enhancement circuit 34 that enhances signal-to-noise-ratio of the temperature signal for input to the evaluator circuit. In additional electronic temperature switch embodiments, the switch derives essentially all operating power from a 2-wire sense circuit. In additional electronic temperature switch embodiments, the electronic temperature switch comprises a 2-wire device powered by a power supply with a series resistance, where the evaluation signal indication is at the junction of the series resistor and the power supply input. In additional electronic temperature switch embodiments, the measurement circuit comprises a temperature sensor 54 with variable resistance based on temperature. In additional electronic temperature switch embodiments, the temperature sensor comprises a resistive element with variable resistance based on temperature.

In additional electronic temperature switch embodiments, the evaluator circuit comprises a window comparator circuit configured for: comparing the temperature signal to a lower reference value corresponding to the lower temperature threshold value; and comparing the temperature signal to a higher reference value corresponding to the higher temperature threshold value; where the window comparator indicates when said temperature signal is between the lower temperature threshold value and an higher temperature threshold value. In additional electronic temperature switch embodiments, the comparator circuit window is adjustable between about ½° and 6°. In additional electronic temperature switch embodiments, the window comparator circuit comprises: a first comparator 36 for comparing the temperature signal to the lower reference value corresponding to the lower temperature threshold value, and a second comparator 37 for comparing the temperature signal to the higher reference value corresponding to the higher temperature threshold value. In additional electronic temperature switch embodiments, comparator hysteresis is reduced by amplifying the generated temperature signal via an operational amplifier 34 to improve a signal to noise ratio of the generated temperature signal.

Additional electronic temperature switch embodiments may further include: a loading circuit 13 that in response to the evaluator circuit, generates a first pre-set output signal indicating when the temperature signal is between the lower threshold value and the higher threshold value, and a second pre-set output signal when the temperature signal is not between the lower threshold value and the higher threshold value. Additional electronic temperature switch embodiments may include a protection circuit 14 that provides over-voltage protection.

An electronic temperature switch device 30 embodiment may include: an electronic temperature switch circuit 10; a temperature sensor 54; and a housing 65 for housing the electronic temperature switch circuit 10 and at least a portion of the temperature sensor 54; where the electronic temperature switch circuit 10, includes: a measurement circuit 11 that measures temperature and generates an temperature signal corresponding to the sensed temperature; and an evaluator circuit 12 that that receives said temperature signal compares said temperature signal to a lower threshold value and an upper threshold value, and generates an evaluation signal indicating when said temperature signal is between the lower temperature threshold value and an higher temperature threshold value.

In additional electronic temperature switch device embodiments, the evaluator circuit has an evaluation circuit ratio independent of power supply voltage. In additional electronic temperature switch device embodiments, the measurement circuit comprises an enhancement circuit that enhances signal-to-noise-ratio of the temperature signal for input to the evaluator circuit. In additional electronic temperature switch device embodiments, the circuit 10 derives essentially all operating power from a 2-wire sense circuit. In additional electronic temperature switch device embodiments, the circuit 10 further comprises: a loading circuit 13 that in response to the evaluator circuit, generates a first pre-set output signal indicating when the temperature signal is between the lower threshold value and the higher threshold value, and a second pre-set output signal when the temperature signal is not between the lower threshold value and the higher threshold value. In additional electronic temperature switch device embodiments, the housing has dimensions of about 1.25 cm by 4.5 cm.

An electronic temperature switch device 30 embodiment may include: an electronic temperature switch circuit 10; a temperature sensor 54; and a housing 65 for housing the electronic temperature switch circuit 10 and at least a portion of the temperature sensor 54; where the electronic temperature switch circuit 10, includes: a measurement circuit 11 that measures temperature and generates an temperature signal corresponding to the sensed temperature; an evaluator circuit 12 that that receives said temperature signal compares said temperature signal to a lower threshold value and an upper threshold value, and generates an evaluation signal indicating when said temperature signal is between the lower temperature threshold value and an higher temperature threshold value; and a loading circuit 13 that in response to the evaluator circuit, generates a first pre-set output signal indicating when the temperature signal is between the lower threshold value and the higher threshold value, and a second pre-set output signal when the temperature signal is not between the lower threshold value and the higher threshold value; and where the evaluator circuit has an evaluation circuit ratio independent of power supply voltage, the measurement circuit enhances signal-to-noise-ratio of the temperature signal for input to the evaluator circuit, and the electronic temperature switch circuit derives essentially all operating power from a 2-wire sense circuit.

Figure 2:
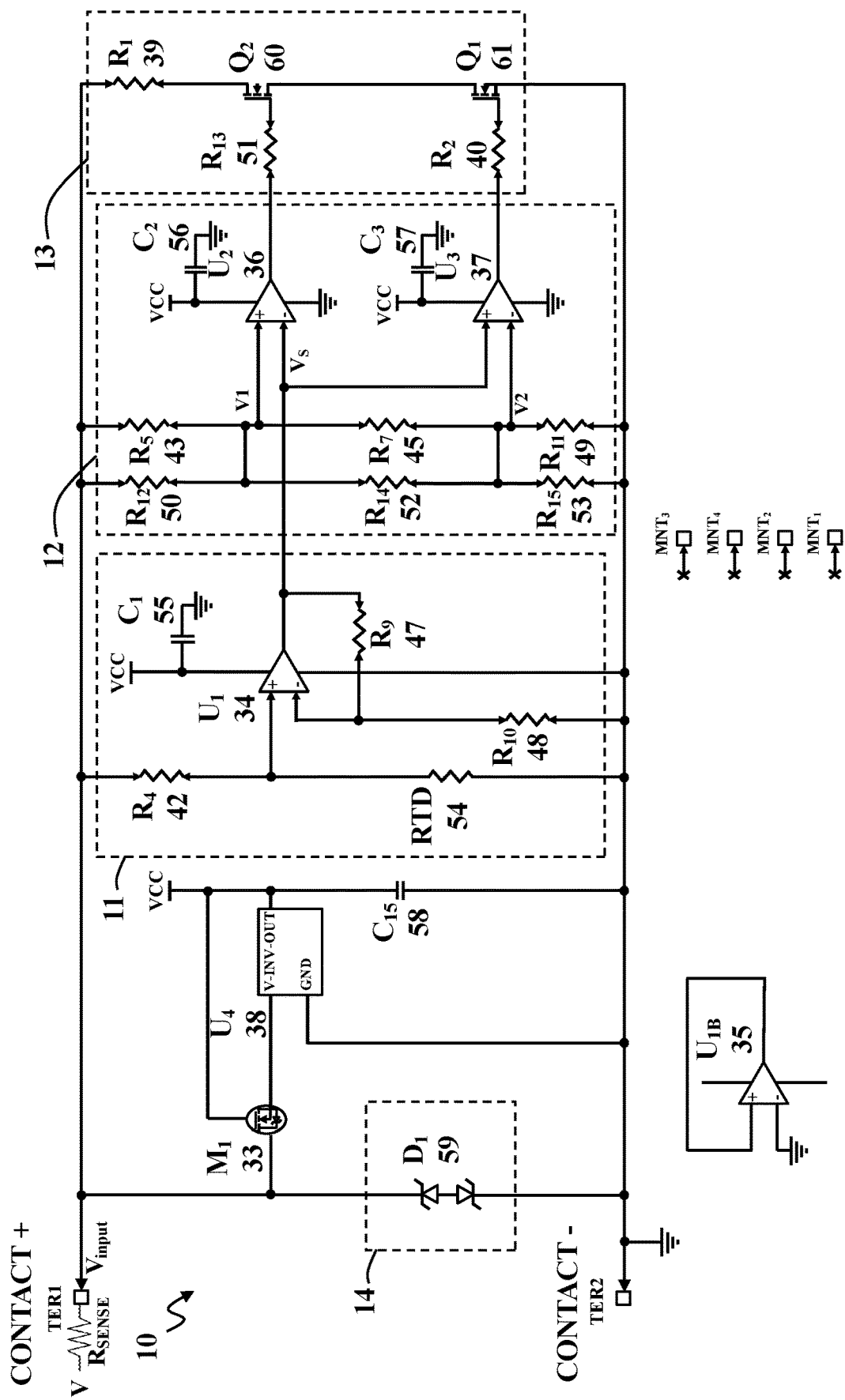
FIG. 2 shows a circuit diagram of an exemplary implementation of the electronic temperature switch of FIG. 1.

Referring to the drawings, FIG. 1 shows a functional block diagram of an embodiment of an electronic temperature switch circuit 10. FIG. 2 shows a circuit diagram of an exemplary implementation of the electronic temperature switch circuit 10 of FIG. 1.

FIG. 1 shows a functional block diagram of an embodiment of said electronic temperature switch circuit 10 which monitors temperature change via a temperature sensor such as a resistance temperature detector (RTD) element in the measurement circuit 11. In one embodiment, the temperature sensor comprises a resistive element with variable resistance based on temperature, whereby a resistance value due temperature is detected in the circuit 10 by detecting a voltage drop across the RTD element. In one embodiment, the disclosed electronic temperature switch 10 provides an indication of sensed temperature being within a specified temperature range or outside the temperature range.

FIG. 2 shows a circuit diagram of an example implementation of the electronic temperature switch circuit 10 of FIG. 1. The electronic temperature switch circuit 10 comprises a temperature measurement stage (module or circuit) 11, an evaluation stage 12, a loading stage 13 and an optional protection stage 14.

In one embodiment, the temperature measurement stage 11 comprises an electronic circuit that is configured to draw a small amount of current to sense the voltage drop across the RTD therein. In one example, the current draw increases as fluid temperature sensed by the RTD decreases, but not large enough to change the output state of circuit 10, or affect the circuit 10 by any significant amount.

The temperature measurement stage 11 develops a window output signal below a first sensed temperature (e.g., below freezing) to obtain a high voltage indication (e.g., the switch is turned off). Above a second temperature (e.g., 175° F.), there is also a high voltage indication from the temperature measurement stage 11. Between the first and second temperatures, there is a low voltage indication from the temperature measurement stage 11. An example of a low voltage indication is about 4 Volts (i.e., 4V) at terminal 1 (TER1) relative to terminal 2 (TER2), and an example of a high voltage indication is about 8V at TER1 relative to TER2, in the circuit 10.

In one embodiment, a platinum resistor is utilized as a temperature sensor (RTD) 54, wherein said platinum changes its resistance over a temperature range. For example, at about 25° C. a PT1000 resistor exhibits 1000Ω (i.e., 1000 Ohm). The RTD is connected in series with a resistor 42 ($R_4$), forming a voltage divider relative to ground, on feeds into an amplifier 34 ($U_1$) in the stage 11. The voltage across the RTD is so measured, and is very closely linear with temperature changes. As the resistance for the temperature sensor changes value, temperature sensor causes a different temperature signal (output voltage) at the input to the amplifier 34, which is then amplified by the amplifier 34 to improve the signal-to-noise ratio.

In one implementation, the evaluation stage 12 comprises an electronic circuit that is configured to evaluate the amplified RTD signal from the temperature measurement (sensor) stage 11, which represents the sensed fluid temperature by the RTD. The evaluation stage 12 utilizes a window comparator for the evaluation which in the example implementation described herein comprises the two comparator integrated circuits 36 ($U_2$) 36 and 37 ($U_3$) connected as shown.

The evaluation stage 12 comprises an evaluator that evaluates the temperature signal by comparing the temperature signal to a lower threshold value and an upper threshold value, and generating an evaluation signal indicating when said temperature signal is between the lower threshold value and an upper threshold value. In one embodiment, the evaluation stage 12 receives the amplified temperature sensor voltage signal from the amplifier 34 of stage 11, which indicates an amplified voltage proportional to the sensed temperature. The amplified voltage is fed into an electronic window comparator circuit comprising comparators 36 and 37. A first comparator 37 is to sense the low temperature (i.e., lower threshold value) based on the sensed voltage, and the other comparator 36 is to sense the high temperature (i.e., upper threshold value) based on the sensed voltage from the measurement stage 11.

Whenever the sensed voltage from the measurement stage 11 rises above a first level (lower level) indicating sensing a first temperature threshold value T1 (e.g., above a freezing point of water), then the voltage is sensed by a first comparator and trips that comparator. When the sensed voltage from the measurement stage 11 raises further above a second level (higher level) indicating sensing a second temperature threshold value T2 (e.g., above 175° F.), then that voltage is sensed by a second comparator and trips the second comparator.

The window comparator determines whether the output from the measurement stage 11 is between two threshold reference voltages (corresponding to said two reference threshold temperatures), by detecting over-voltage or under-voltage. As shown in FIG. 2, each single comparator detects a common input voltage Vs from measurement stage 11 against one of two reference voltages V1 and V2. The voltage Vs represents the sensed temperature by the RTD from the measurement stage 11. The reference voltages V1 and V2 are established by the series connected resistors 50, 52, 53 that form a first comparison reference voltage-divider, and the series connected resistors 43, 45, 49 that form a second comparison reference voltage-divider.

An upper level voltage at V1 (corresponding to e.g. a higher temperature threshold) is sensed by comparator 36, and a lower voltage at V2 (corresponding to e.g. a lower temperature threshold) is sensed by compactor 37.

In one embodiment, the comparator outputs are fed to a logic gate (e.g., AND or NAND) that detect the input as in range of the so-called "window" between upper and lower reference voltages.

The comparator outputs drive the loading stage 13. Based on the comparison of Vs with V1 and V2, the two comparator outputs 36 and 37 provide a high voltage condition (e.g., such as 4V) sufficient to turn on the loading stage transistors $Q_1$ and $Q_2$ in the loading stage 13, or a low voltage condition sufficient to turn off the loading stage transistors $Q_1$ and $Q_2$.

The comparator output from stage 12 is fed into the loading stage 13 which in one embodiment comprises two transistors 60 and 61. The transistors 60 and 61 function as a loading switch that is turned on or off (based on comparator window signal from stage 11) to generate pre-set output voltages of low such as 4V, or high such as 8V, at TER1 relative to TER2. In other embodiments, the two pre-set output voltages could be other pre-set voltages (e.g., as low as 0.7 V and up to about 28V, or higher as needed). The two transistors in the stage 12 may be simplified to one transistor in some embodiments.

The protection stage 14 protects against transient signals or electrical noise in the overall circuit (e.g., lightning strikes, ringing effects from turning a switch on or off, etc.).

The disclosed electronic temperature switch 10 enables adjustment of comparator hysteresis to as much or as little as desired by a user (e.g., about ½° or 6°). A series sensing resistor 5 (i.e., $R_{SENSE}$) may be located at TER1 to sense a voltage at TER1 with respect to TER2.

The output voltage of temperature measurement stage 11 and all measurements are performed ratiometrically (output is directly proportional to input). The output voltage at TER1 ($V_{input}$) is referenced to a supply voltage VCC at $R_{SENSE}$. The ratio of RTD resistance to a fixed value resistor 42 ($R_4$) essentially does not vary with voltage. The evaluator stage 11 is established using an evaluation circuit ratio independent of power supply voltage.

In one implementation, the temperature measurement stage 11 utilizes said active component 34 comprising an amplifier $U_1$ configured to amplify the sensed values by the RTD, and operate at low voltage levels (e.g., less than 2 Volts) while drawing low current (e.g., less than 2 micro-Amp of quiescent current). Preferably, an amplifier 34 ($U_1$) has low input offset, low current draw and "zero-drift", and can use a single-supply power. The measurement state 11 enhances the temperature sensor signal-to-noise-ratio using an enhancement circuit comprising the component 34, for presentation to the evaluator stage 12.

In one implementation, the evaluation stage 12 utilizes said active component comprising said window comparator configured to operate at less than e.g. about 4V as depicted, with typical operating ranges extending to lower and higher voltages, and draw less than e.g. about 1 milliamp of quiescent current.

The loading stage 13 comprises an electronic circuit that in one example provides switching between high (8 Volts) and low (4 Volts), and logic inversion. The logic of the evaluation stage 12 can be inverted from the desired output by stage 13 as depicted, and a pull-up resistor 39 ($R_1$) in stage 13 is set large enough to provide operating voltage to the electronic circuits of 10 and small enough to provide a significant load with transistors $Q_2$ and $Q_1$ on, to cause a detectable voltage drop across $R_{SENSE}$. Example sensed voltage across TER1 and TER2 are 4V with transistors $Q_2$ and $Q_1$ on, and 8V with transistors $Q_2$ and $Q_1$ off.

The optional protection stage 14 comprises an electronic circuit 59 that provides over-voltage protection, comprising back-to-back connected Zener diode circuit 59 ($D_1$), or a Transient Voltage Suppressor, that clips voltage.

An external power supply VCC (e.g., 15 Volts) is coupled to the circuit 10 via the external $R_{SENSE}$ resistor (e.g., 1.5 KΩ), whereby the electronic temperature circuit 10 operates by drawing more, or less current to alter the voltage measured at the terminals TER1 and TER2. The electronic switch circuit 10 derives essentially all operating power from a 2-wire sense circuit.

Under normal operating conditions, the value of the RTD 54 in stage 11, and said pull-up resistor 42 in stage 13, result in a voltage divide ratio that does not vary with voltage. The resulting voltage across the RTD 54 is amplified by the amplifier 34 to swamp out the effects of comparator hysteresis and improve the signal to noise ratio.

The amplified temperature voltage Vs signal from the measurement stage 11 is fed into said window comparator comprising the two comparator integrated circuits 36 ($U_2$)

and 37 ($U_3$) in the evaluation stage 12. The outputs of the window comparators drive a set of MOSFET transistors 60 ($Q_1$) and 61 ($Q_2$) that are driven in series. In the active region of operation, the transistors 60 ($Q_1$) and 61 ($Q_2$) are active and draw current through both resistors 5 and 39 ($R_{SENSE}$ and $R_1$).

In one embodiment, the outputs of the window comparators are first NAND gated together. In one embodiment, an open collector output may be used instead of the NAND circuit implemented by MOSFETS 60 and 61. As such, for the output circuit, a low power NAND with open collector output may be used instead of MOSFETS.

The resistors RTD 54 and resistor 42 form a measurement voltage divider at an input of the amplifier to measure voltage drop across RTD 54 indicative of sensed temperature. The series connected resistors 50, 52 and 53 form a first comparison voltage divider. The series connected resistors 43, 45 and 49, form a second comparison voltage divider.

As the voltage drops across the entire circuit, all ratios of measurement resistors (i.e., RTD 54 and resistor 42), and comparison resistors ($R_{12}$ 50, $R_{14}$ 52, $R_{15}$ 53 and $R_5$ 43, $R_7$ 45, $R_{11}$ 49) are held constant by their component values, thus the evaluation performed by the window comparator is unaffected, and the circuit is stable.

Hysteresis of the comparators 36 and 37 provides stability by applying internal positive feedback that latches the window comparator output into a discrete state. This affects the temperature transition point temperatures T1 and T2 (e.g., T1 about 37° F. to T2 about 175° F.) introducing a hysteresis or change in the set point when the temperature change reverses direction.

Preferably, comparators 36 and 37 in the circuit 10 have high input impedance, low current draw, and operate from low voltage. The same applies to the operational amplifier 34 (op-amp $U_1$). In one embodiment, large value resistors 50, 52, 53 and 43, 45, 49 are coupled to the comparators 36, 37, and large value resistors 54, 42 are coupled to the op-amp 47, since the input impedances of the comparators and op-amp is not infinite.

For the comparators 36 and 37, an amount of hysteresis is desired to prevent the circuit 10 from oscillating at said trip points T1 and T2 (e.g., T1 about 37° F. to T2 about 175° F.). In one example, a comparator with about 2 mV of hysteresis yields about 6° F. hysteresis.

In one example each comparator 36, 37 preferably operates down to less than 2 Volts, or ideally 1 Volt. Each op-amp comparator preferably draws less than 1 mA of current.

The high voltage protection circuit 14, and a voltage regulator circuit comprising MOSFET 33 ($M_1$) and micropower voltage reference unit 38 ($U_4$), is also included in the front end to provide +5V power to the comparators and op amps.

The doubled up resistors (50, 52, 53 and 43, 45, 49) for the window comparator allow the selection of standard value resistors for a wide range of set point temperature set threshold values T1 and T2 to be achievable. Effectively with a set of three resistors, the ratio of these three resistor values define said temperature set thresholds (T1 and T2). To implement a specific temperature switch point, two standard resistor values that combine in parallel, or series can be selected to produce the desired temperature switch or thresholds set point value.

As noted, in one embodiment, the electronic temperature circuit 10 indicates when a sensed fluid temperature X falls within a fault condition range (e.g., less than 37° F. or greater than 175° F.). This will be indicated by a high voltage limit (e.g., 8 Volts). When the fluid is within a range of 37° F.<X<175° F., a low voltage (e.g., 4 Volts) will be presented at the terminal 1 (TER1) to terminal 2 (TER2) point. In one implementation, the electronic temperature switch 10 comprises a two-wire device powered by a 15 Volt supply VCC with a 10 KΩ series resistor $R_{SENSE}$ (i.e., 2-wire sense circuit). That is $R_{SENSE}$ bottom at TER1 with respect to power return at TER2. The voltage indication of whether the sensed fluid temperature X falls inside or outside a fault condition range is taken at the junction of the 10 KΩ resistor $R_{SENSE}$ at TER1 with respect to TER2.

In one embodiment of the electronic temperature circuit 10, at specific temperature set points T1 and T2 the window comparators 36 and 37 change output state. The state change indicates the condition with two set point temperatures T1 and T2 (such as less than 37° F. or greater than 175° F.), or combining the two comparator states between the two set point temperatures. In one embodiment, the window comparators comprise two high temperature comparator integrated circuits with corresponding all high temperature resistors and capacitors (e.g., about 150° C.).

In one embodiment, the design of the electronic switch circuit 10 is modeled with all switching to be ratiometric to the input power. Based on power supply variations, changes in power supply series resistance or stability factors, a voltage reference may be added.

In one embodiment, a comparator IC can be configured in either a switch on high voltage or switch on low voltage. This provides a configuration to sense voltages representing temperatures below a first temperature set point T1 (e.g., 37° F.) or above a second temperature set point T2 (e.g., 175° F.). The comparators 36 and 37 in stage 11 feed a logic circuit 13 that detects when both signals are between a first temperature set point T1 and a second temperature set point T2 (i.e., within temperature range from T1 and T2).

When the sensed temperature is within said temperature range, the logic output 13 is set to draw increased current. In one example implementation, by pulling increased current, the voltage drop across a resistor e.g., $R_{SENSE}$ 10 KΩ external switch circuit 10) in series with a power supply, causes the switch sense voltage to drop below a low voltage (e.g., about 4 Volts). For all other conditions, the current draw is kept low enough to cause the sense voltage to be greater than high voltage (e.g., about 8 Volts).

In one example implementation, the circuit 10 is configured to operate on about 3.3 Volts to about 12 Volts and less than about 1.5 mA (milliamps). This allows the circuit 10 to be powered whether the logic 12 is in the on or off state. The protection circuit 14 may be added to limit the maximum internal voltage to less than (e.g., about 12 Volts) in case of a fault condition of the power supply.

In one example implementation, a 1.5 KΩ resistor may be used in place of the 10 KΩ series resistor $R_{SENSE}$. This would increase the current to (15-4) volts/1.5 KΩ or 7.3 mA. With this current level, other electronic switch IC designs may be utilized.

In one example, the excitation voltage VCC for the circuit 10 may be 15 VDC at 1.5 mA. The actuation temperature may be T1 at about 37° F. (2.78° C.)+/−5° F. to T2 at about 175° F. (79.4° C.)+/−5° F. The RTD 54 at 32° F. (0° C.) may be 1000Ω. The RTD at 37° F. (2.78° C.) may be 1010.85Ω. The RTD at 175° F. (79.4° C.) may be 1306.85Ω. One embodiment of the switch 10 in FIG. 2 may have the following passive component approximate values: resistor $R_1$ 39 is 976Ω, resistor $R_2$ 40 is 100Ω, resistor $R_4$ 42 is 23.7 KΩ, resistor $R_5$ 43 is 147 KΩ, resistor $R_7$ 45 is 30.1 KΩ, resistor $R_9$ 47 is 200 KΩ, resistor $R_{10}$ 48 is 23.7 KΩ, resistor $R_{11}$ 49 is 71.5 KΩ, resistor $R_{12}$ 50 is 76.8 KΩ, resistor $R_{13}$ 51 is 100 KΩ, resistor $R_{14}$ 52 is 14.7 KΩ, resistor $R_{15}$ 53 is 71.5 KΩ, capacitor $C_1$ 55 is 0.1 µF, capacitor $C_2$ 56 is 0.1 µF, capacitor $C_3$ 57 is 0.1 µF and capacitor $C_{15}$ 58 is 0.1 µF. amplifier U1B 35 may be an integrated differential amplifier. The components and values used in the electronic temperature switch circuit 10 are by way of example, and those skilled in the art recognize that other components and values can be used which achieve the functions of the disclosed switch device, described herein. Although in the embodiment of circuit 10 shown in FIG. 2, TER2 is shown grounded, in another embodiment TER2 can be coupled to a voltage source that is not zero (i.e., not grounded).

FIG. 3A shows a top view of an assembled electronic temperature switch device 30 which may include the electronic temperature switch circuit 10 in FIG. 2. FIG. 3B shows a side view of the assembled electronic temperature switch device 30 of FIG. 3A. FIG. 3C shows a front view of the assembled electronic temperature switch device 30 of FIG. 3A. FIG. 3D shows a detail view about A of the assembled electronic temperature switch device 30 of FIG. 3A.

In one embodiment, RTD element 54 is located within the stub 62 of the electronic temperature switch device 30 as shown in FIGS. 3B-3C. In one embodiment, the electronic temperature switch circuit 10 is implemented on a printed circuit board (PCB), depicted by dashed lines, located within the body 64 of the temperature switch device 30, on a round PCB board 63 within the plane perpendicular to the drawing of the electronic temperature switch device 30, as shown in FIG. 3C.

In one embodiment, the switch device 30 may have a housing 65 including a generally cylindrical body 64 with an extension stub 62, and a generally cylindrical connector tube 66 extending transversely from a side of the body 64. The electrical connections to the circuit 10 are via pin contacts 67 at an outlet of the connector 66. The RTD element 54 is disposed in the stub 62 and electrically connected to the circuit 10 disposed in the body 64. Example geometry and dimensions of the housing are provided herein (others within the scope of the disclosed switch are possible).

In one example, the housing 65 has one or more of the following exterior approximate dimensions, wherein: dimension A is 0.495 in. (1.2573 cm.) max, dimension B is R.031 in. (0.07874 cm.) to 0.061 in. (1.5494 cm.), dimension C is 0.180 in. (0.4572 cm.) to 0.190 in. (0.4826 cm.), dimension D is R.010 in. (0.0254 cm.) to 0.015 in. (0.0381 cm.), dimension E is 0.135 in. (0.3429 cm.) to 0.145 in. (0.3683 cm.), dimension F is 0.415 in. (1.0541 cm.) to 0.425 in. (1.0795 cm.), dimension G is 0.9375 in. (2.38125 cm.) max, dimension H is 2×0.435 in. (1.1049 cm.) to 0.440 in. (1.1176 cm.), dimension I is a master keyway +/−5°, dimension J is 1.226 in. (3.11404 cm.) to 1.236 in. (3.13944 cm.), dimension K is R.625 in. (1.5875 cm.) max, dimension L is 0.177 in. (0.44958 cm.) to 0.187 in. (0.47498 cm.), dimension N is 2×R.695 in. (1.7653 cm.) to 0.705 in. (1.7907 cm.), dimension O is 1.029 in. (2.61366 cm.) to 1.039 in. (2.63906 cm.), dimension P is 1.029 in. (2.61366 cm.) to 1.039 in. (2.63906 cm.), dimension Q is 2×Ø.216 in. (0.54864 cm.) to 0.226 in. (0.57404 cm.), dimension M is R.219 in. (0.55626 cm.) min clearance for socket 2 PL, dimension S is a connector per EN29997YE-1-1006MN, dimension T is 44° to 46°, dimension U is Ø1.181 in. (2.99974 cm.) to 1.183 in. (3.00482 cm.), dimension V is Ø1.017 in. (2.58318 cm.) to 1.020 in. (2.5908 cm.), dimension W is 0.135 in. (0.3429 cm.) to 0.145 in. (0.3683 cm.), dimension X is 2×R.020 in. (0.0508 cm.) to 0.040 in. (0.1016 cm.), dimension Y is 2×R.003 in. (0.00762 cm.) to 0.010 in. (0.0254 cm.), and dimension Z is 0.03 in. (0.0762 cm.). An electrically conductive material 32 may be bonded on upper and lower flange surfaces at both fasteners hole locations. The operating pressure may be 60 pounds per square inch absolute (PSIA). The proof pressure may be 120 PSIA. The burst pressure may be 195 PSIA.

In one embodiment, the switch device 30 has a smaller size than convention mechanical temperature switches, wherein dimension A is about is 1.25 cm, and combination of dimensions H, G, F is about 4.5 cm. The RTD is about 1.27 cm long. Main body 64 is about 4.6 cm long. Tube diameter is about 1.9 cm to 2.5 cm. Connector tube about 1.3 cm long.

In one embodiment, the electronic temperature switch circuit 10 functions as a fluid temperature switch such as a fuel temperature switch, in one example being an indicator of an acceptable fluid temperature range T1 to T2 (e.g., T1 about 37° F. to T2 about 175° F.), and an unacceptable fluid temperature range (e.g., less than about 37° F. and greater than about 175 degrees ° F.). In one example, an example acceptable range of sensed temperature is indicated by the output of circuit 10 as an 8 Volt signal and an unacceptable indication is shown as a less than a 4 Volt signal, output from circuit 10 at terminal TER1. FIG. 4A shows an example output voltage graph 70 of a closing (e.g., acceptable indication) and opening (e.g., unacceptable indication) of the disclosed electronic temperature circuit 10 at different threshold temperatures.

FIG. 4B shows a wiring diagram 71 of the electronic temperature switch 30, as input and output to circuit 10 (i.e., excitation and excitation return). The electronic temperature switch circuit 10 operates in place of a mechanical switch functioning from a 2-wire sense circuit. The electronic switch circuit 10 derives all operating power from the 2-wire sense circuit.

Figure 5A:
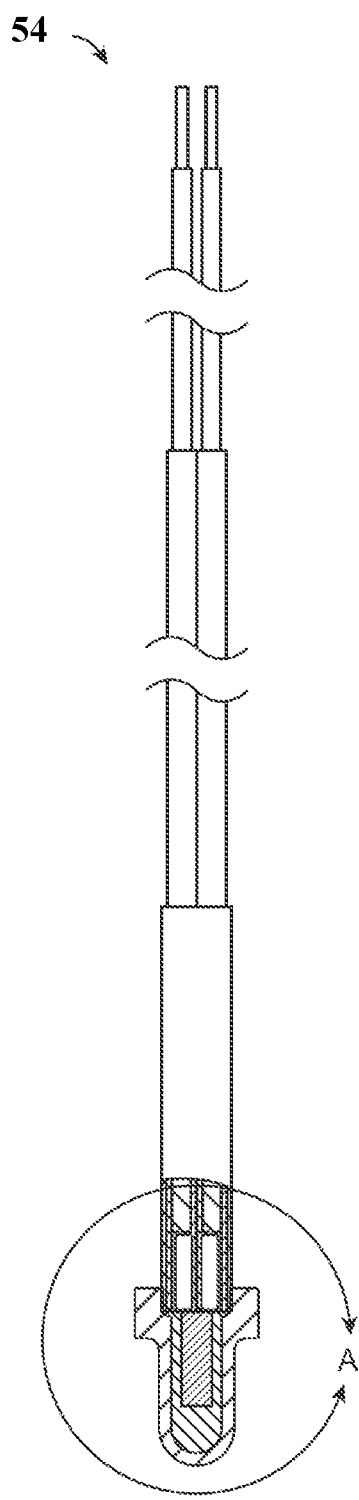
FIG. 5A shows a temperature sensor comprising a resistance temperature detector (RTD) as a core temperature sensor element in the electronic temperature switch device.
Figure 5B:
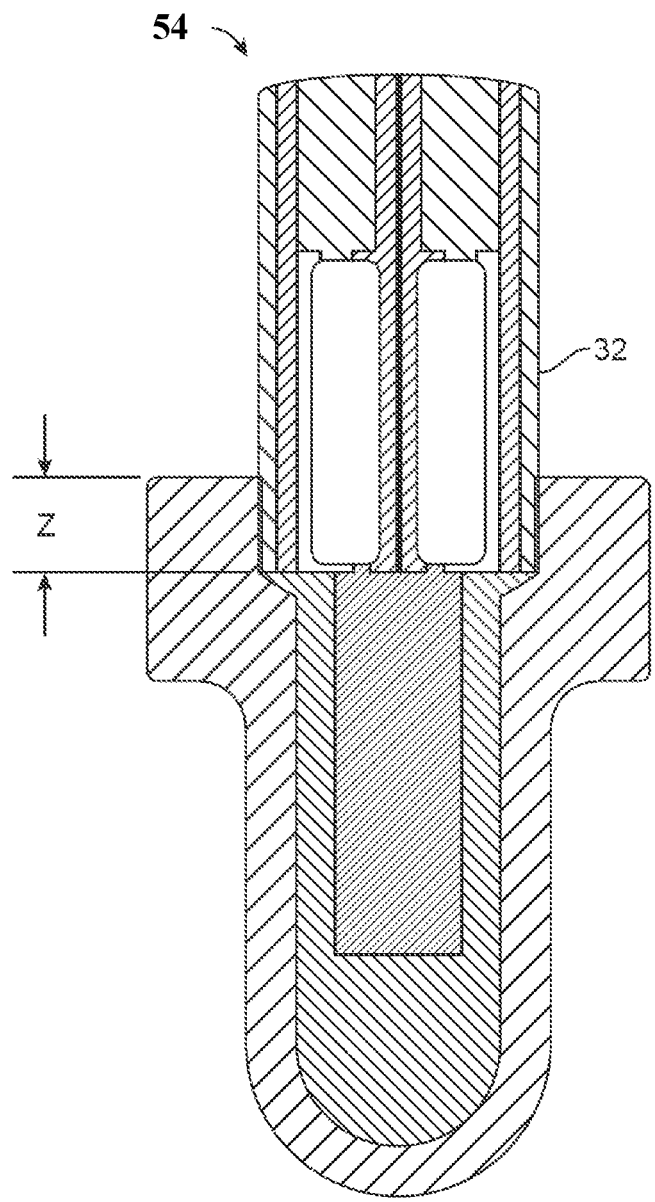
FIG. 5B shows a detail view about A of the RTD of FIG. 5A.

In one embodiment, the electronic temperature switch device 30 utilizes a robust Thin film PT1000 RTD 54 as the core temperature sensor. FIG. 5A shows a temperature sensor (RTD) 54 as a core temperature sensor element in the electronic temperature switch device. FIG. 5B shows a detail view about A of the RTD 54 of FIG. 5A.

In one embodiment, the electronic temperature switch device 30 assembly is thermally compensated to desired requirements of accuracy, and output level. The electronic temperature switch device design utilizes machined, all welded construction with a sealed thermo-well welded to the interface port. The thermo-well 54 is connected to the envelope in such a manner as to be immersed in the fluid media where temperature is to be sensed. The RTD element senses temperature by increasing resistance with temperature.

The electronic temperature switch device 30 comprising said electronic temperature circuit 10 monitors the resistance change by detecting a voltage drop across the RTD element 54. This voltage is appropriately amplified to increase the sensitivity of temperature sensing to utilize an integrated circuit based window comparator circuit, as described herein. The electronic temperature switch device 30 can be utilized in many applications such as aircraft fuel in fuel lines or tanks, engine oil, bleed air, etc.

Figure 6:
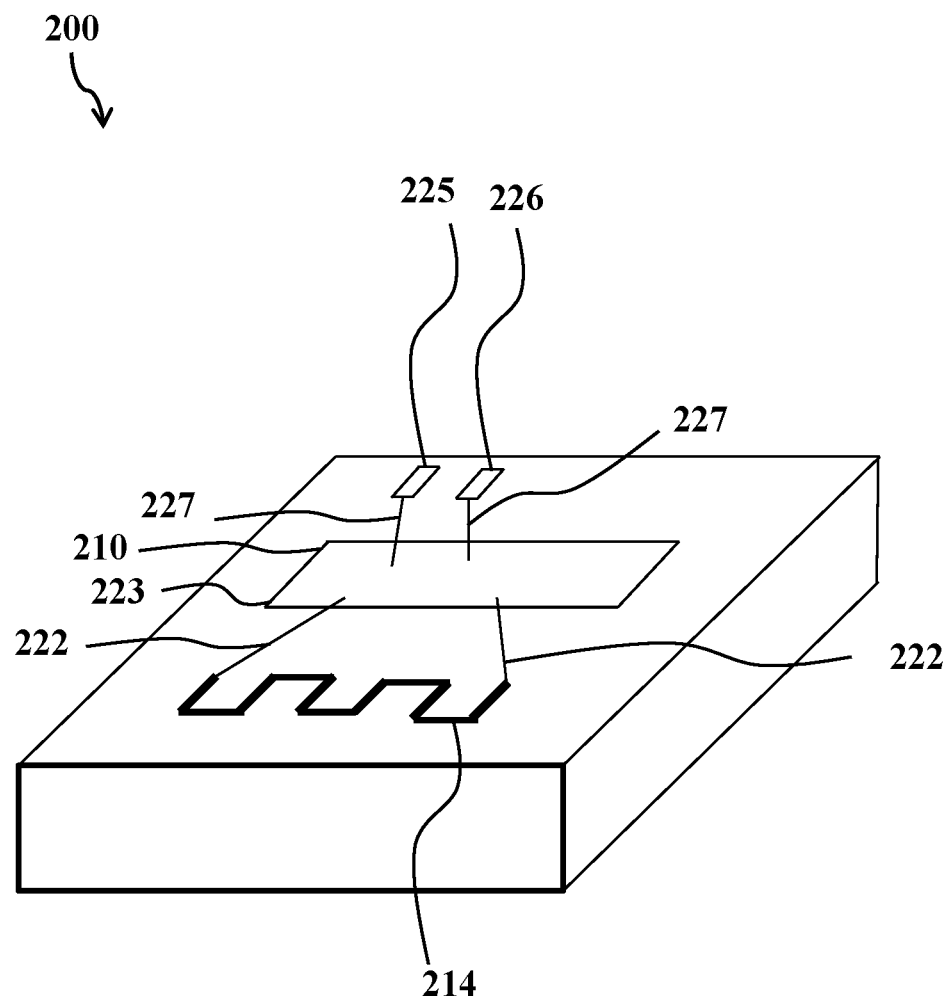
FIG. 6 shows a perspective view of an integrated Micro Electro-Mechanical System (MEMS) of an electronic temperature switch.
Figure 7A:
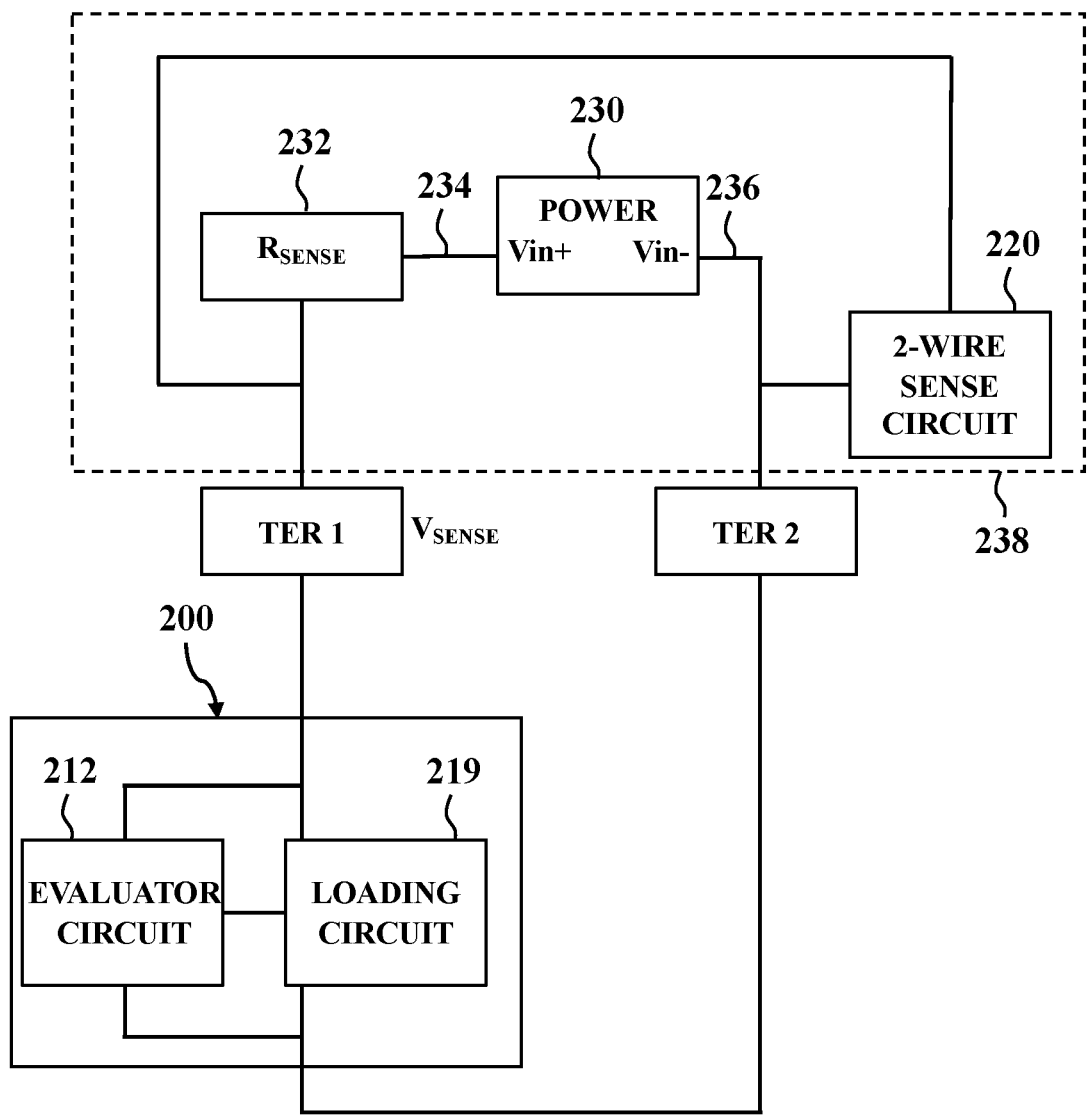
FIG. 7A shows a block diagram of an integrated MEMS of FIG. 6.
Figure 7B:
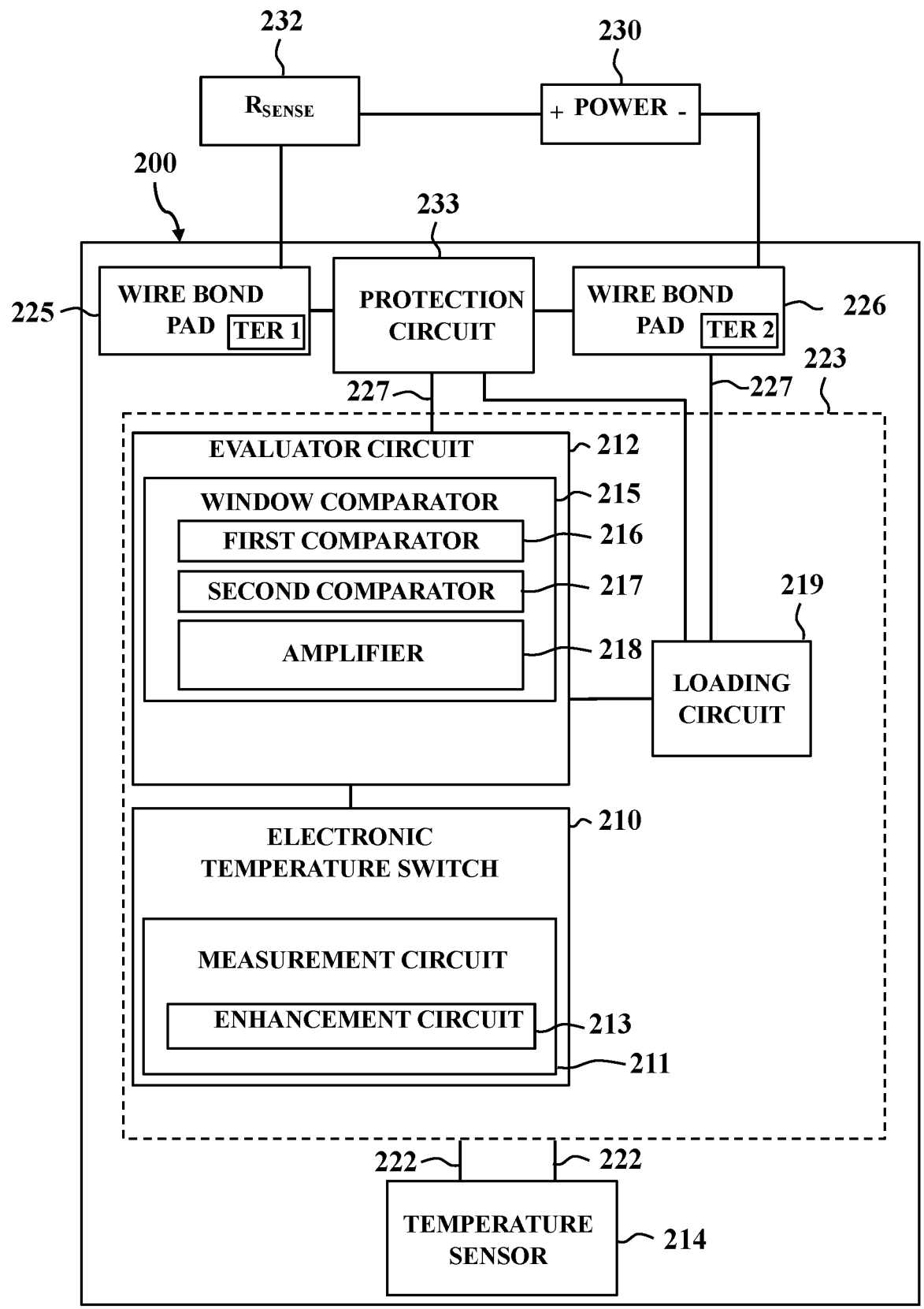
FIG. 7B shows a block diagram of the integrated MEMS of FIG. 7A.

In accordance with another embodiment, FIGS. 6, 7A, and 7B show diagrams of an integrated Micro Electro-Mechanical System (MEMS) electronic temperature switch device 200, disclosed herein. FIG. 7A shows a block diagram of an integrated MEMS of FIG. 6, which is illustrated as an example implementation in FIG. 7B. The MEMS device temperature switch 200 is shown connected to an electronic sense circuit 220 such that in one embodiment the MEMS device 200 derives power from the external two-wire sense circuit 220. An external monitoring circuit (or external sensing circuit) 238 is shown in dashed lines in FIG. 7A.

In one example implementation illustrated in FIG. 7B, an integrated Micro Electro-Mechanical System (MEMS) device 200 may include an electronic circuit 223 comprising an integrated circuit (IC) fabricated from a common substrate. In one embodiment, the electronic circuit 223 provides temperature measurement and evaluation functions as described herein.

The electronic circuit 223 may include a microelectronic temperature switch 210. The microelectronic temperature switch 210 may include a temperature measurement circuit 211 that measures temperature and generates a temperature signal corresponding to the sensed temperature. The electronic circuit 223 further comprises an evaluator circuit 212 that receives said temperature signal and compares said temperature signal to a lower temperature threshold value and an upper temperature threshold value, and generates an evaluation signal indicating when said temperature signal is between the lower temperature threshold value and a higher temperature threshold value.

The MEMS device electronic temperature switch embodiment 200 as shown in FIGS. 6, 7A and FIG. 7B may perform functions in a same or similar manner to those in the electronic temperature switch of FIG. 1.

In one example implementation, the Temperature Measurement Stage 11 of FIG. 1 may correspond to the Measurement Circuit 211 of FIG. 7B; the Evaluation Stage 12 of FIG. 1 may correspond to the Evaluator Circuit 212 of FIG. 7B; the Loading Stage 13 of FIG. 1 may correspond to the Loading Circuit 219 of FIG. 7B; the Protection Stage 14 of FIG. 1 may correspond to the Protection Circuit 233 of FIG. 7B; the Electronic temperature switch circuit 10 of FIG. 1 may correspond to the Electronic Temperature Switch 210 of FIG. 7B; and the "Contact+" and "Contact-" of FIG. 1 (i.e., TER1 and TER2, respectively) may correspond to the Wire Bond Pads 225, 226 of FIG. 7B, respectively. The MEMS device 200 is integrated, which makes certain components simpler and may make the form factor smaller, such as by a factor of 50, as compared to the electronic temperature switch of FIG. 1.

In one embodiment, a power supply 230 connected to the MEMS device 200 may have a high side voltage (Vin+) and a low side voltage (Vin−), with two wires 234 and 236, respectively. The signal from the high side 234 of the power supply 230 may pass through a series sensing resistor RSENSE 232. Further, RSENSE 232 passes the signal into the MEMS device 200 via a wire pond pad (e.g., wire bond pad 225), as shown in FIG. 7B. The signal from the low side 236 of the power supply 230 is connected to the wire bond pad 226.

In one example, a first electrical connection from the wire bond pad 225 is connected to the protection circuit 233, wherein the protection circuit 233 is connected to an evaluator circuit 212 of the MEMS device 200, to power the system. A second connection from a wire bond pad 227 may be electrically connected to a loading circuit 219 of the MEMS device 200. The low side 236 (or power return) of the power source 230, is electrically connected to the MEMS device 200 to power the complete system. The low side 236 of the power source 230 may also be connected into the loading circuit (i.e., load) 219 of the MEMS device 200 via the wire bond pad 226. Two wires 227 feed power into the MEMS device 200 and act as an indicator. When the loading circuit 219 is on, voltage Vsense (i.e., TER1) at circuit 220 goes low. When the loading circuit 219 is off, voltage Vsense at circuit 220 goes high. There is no sense circuit except an external measure of this voltage. Power is also the indicator. In one implementation, an example of a low voltage indication is about 4 Volts (i.e., 4V) at terminal 1 (TER1) relative to terminal 2 (TER2), and an example of a high voltage indication is about 8V at TER1 relative to TER2, in the circuit 200.

In additional MEMS device electronic temperature switch embodiments disclosed herein, the evaluator circuit 212 may have an evaluation circuit ratio independent of power supply voltage. In additional microelectronic temperature switch embodiments of the MEMS device 200, the measurement circuit 211 may comprise an enhancement circuit 213 that enhances signal-to-noise-ratio of the temperature signal for input to the evaluator circuit. In an embodiment, the enhancement circuit 213 may be external to the measurement circuit 211.

In additional microelectronic temperature switch embodiments, the electronic temperature switch 210 may derive essentially all operating power from a 2-wire sense circuit 220.

In additional microelectronic temperature switch embodiments, the microelectronic temperature switch 210 may comprise a 2-wire device 220 powered by a power supply with a series resistance, where the evaluation signal indication is at the junction of the series resistor and the power supply input.

In additional microelectronic temperature switch embodiments, the measurement circuit 211 may comprise a temperature sensor with variable resistance based on temperature.

In additional microelectronic temperature switch embodiments of the MEMS device disclosed herein, the temperature sensor 214 may comprise a resistive element with variable resistance based on temperature. In additional microelectronic temperature switch embodiments of the MEMS device, the evaluator circuit 212 may comprise a window comparator circuit 215 configured for: comparing the temperature signal to a lower reference value corresponding to the lower temperature threshold value; and comparing the temperature signal to a higher reference value corresponding to the higher temperature threshold value; where the window comparator 215 indicates when said temperature signal is between the lower temperature threshold value and an higher temperature threshold value. In additional microelectronic temperature switch embodiments of the MEMS device 200, the comparator circuit window may be adjustable between about ½° and 6°. In additional microelectronic temperature switch embodiments of the MEMS device 200, the window comparator circuit 215 may comprise: a first comparator 216 for comparing the temperature signal to the lower reference value corresponding to the lower temperature threshold value, and a second comparator 217 for comparing the temperature signal to the higher reference value corresponding to the higher temperature threshold value.

In additional MEMS device embodiments, comparator hysteresis may be reduced by amplifying the generated temperature signal via an amplifier 218 to improve a signal to noise ratio of the generated temperature signal. Additional microelectronic temperature switch embodiments of the MEMS device 200 may include: a loading circuit 219 that in response to the evaluator circuit 212, generates a first pre-set output signal indicating when the temperature signal is between the lower threshold value and the higher threshold value, and a second pre-set output signal when the temperature signal is not between the lower threshold value and the higher threshold value. In one embodiment, a pair of wire bond pads (e.g., wire bonds pads 225, 226 of FIG. 6) may pass both the first pre-set output signal and the second pre-set output signal to the electronics circuit 223 for power and signal. In one embodiment, the temperature signal may be derived when a load is either connected (e.g., low impedance, high current draw), or turned off (e.g., high impedance low current draw).

Additional microelectronic temperature switch embodiments may include a protection circuit 233 that provides over-voltage protection.

The components of the integrated Micro Electro-Mechanical System (MEMS) device 200 disclosed herein may be spatially disposed in different ways, according to different embodiments. An integrated Micro Electro-Mechanical System (MEMS) device 200 may include an integrated circuit (IC) fabricated from a common substrate, where the IC may include a microelectronic temperature switch 210 which in one embodiment provides temperature sensing and measurement functions. In another embodiment, the MEMS device 200 may be placed in a housing. In another embodiment, the MEMS device 200 may include a housing for housing the electronic temperature switch circuit 210 and at least a portion of a temperature sensor. In another embodiment, the housing may house just the microelectronic temperature switch circuit 210. In one embodiment, the MEMS device 200 may be mounted in a thermowell type enclosure that encloses the MEMS device 200.

In another embodiment, the microelectronic temperature switch circuit 210, includes: a measurement circuit 211 that measures temperature and generates a temperature signal corresponding to the sensed temperature; and an evaluator circuit 212 that that receives said temperature signal compares said temperature signal to a lower threshold value and an upper threshold value, and generates an evaluation signal indicating when said temperature signal is between the lower temperature threshold value and an higher temperature threshold value.

In additional microelectronic temperature switch device embodiments of the MEMS device 200, the evaluator circuit 212 may have an evaluation circuit ratio independent of power supply voltage. In additional microelectronic temperature switch device embodiments of the MEMS device 200, the measurement circuit 211 may comprise an enhancement circuit 213 that enhances signal-to-noise-ratio of the temperature signal for input to the evaluator circuit 212. In additional microelectronic temperature switch device embodiments of the MEMS device 200, the IC may derive essentially all operating power from a 2-wire sense circuit 220. In additional microelectronic temperature switch device embodiments of the MEMS device 200, the IC may further include: a loading circuit 219 that in response to the evaluator circuit 212, causing a first pre-set output signal indicating when the temperature signal is between the lower threshold value and the higher threshold value, and a second pre-set output signal when the temperature signal is not between the lower threshold value and the higher threshold value. In one embodiment, the first and second pre-set signals are detected across a sense resistor, such as sense resistor 5 of FIG. 1 as current draw is set to be a high value or a low value representing the detected threshold state of the temperature signal. In additional MEMS device embodiments, the MEMS device may have dimensions of approximately 3 mm by 5 mm. In another embodiment, the MEMS device may have slightly larger dimensions. In another embodiment, the MEMS device may have slightly smaller dimensions.

An integrated Micro Electro-Mechanical System (MEMS) device 200 may include an integrated circuit (IC) fabricated from a common substrate, where the IC may include a microelectronic temperature switch 210, the microelectronic temperature switch 210 may include: a microelectronic temperature switch circuit; a temperature sensor 214; and a housing for housing the microelectronic temperature switch circuit and at least a portion of the temperature sensor; where the microelectronic temperature switch circuit 210, includes: a measurement circuit 211 that measures temperature and generates a temperature signal corresponding to the sensed temperature; an evaluator circuit 212 that that receives said temperature signal and compares said temperature signal to a lower threshold value and an upper threshold value, and generates an evaluation signal indicating when said temperature signal is between the lower temperature threshold value and an higher temperature threshold value; and a loading circuit 219 that in response to the evaluator circuit, generates a first pre-set output signal indicating when the temperature signal is between the lower threshold value and the higher threshold value, and a second pre-set output signal when the temperature signal is not between the lower threshold value and the higher threshold value; and where the evaluator circuit 212 has an evaluation circuit ratio independent of power supply voltage, the measurement circuit 211 enhances signal-to-noise-ratio of the temperature signal for input to the evaluator circuit 212, and the electronic temperature switch circuit derives essentially all operating power from a 2-wire sense circuit 220.

An integrated Micro Electro-Mechanical System (MEMS) device 200 may include an integrated circuit (IC) fabricated from a common substrate, where the IC may include fabricated elements such as at least one transistor, at least one amplifier, precision voltage references, matched current sources and current mirrors, and temperature sensing elements, such as junction temperature sensors, temperature variable resistors, and thermo-voltaic temperature sensors.

Embodiments of an integrated Micro Electro-Mechanical System (MEMS) device 200 include an electronic temperature switch device 210 comprising a temperature sensor 214 and an electronic temperature switch circuit 210, are disclosed herein. In one embodiment, the MEMS device 200 indicates when a fluid temperature falls within a fault condition range. The MEMS device integrates the electronic components of the electronic temperature switch described above using integrated circuit fabrication technology to build a single chip device to perform all of the same functions. In one embodiment, the chip may be fabricated from a single substrate, such as silicon. In one embodiment, fabrication of the MEMS device may involve a micromachining process including the selective removal of silicon or the addition of other structural layers.

The two wire electronic temperature switch embodiments described above define the functional parts, operation, considerations and features that comprise the two wire electronic temperature switch device, such as electronic temperature switch device 30. These functions are defined to be implemented by use of components such as printed circuit boards, integrated circuits, resistors, capacitors, connectors and similar electronic components and packages. The MEMS device 200 described herein may provide for miniaturizing the two wire electronic temperature switch into a single functional integrated electronics/temperature sense element.

Incorporating all of the functions described into the MEMS device 200 utilizes all of the unique features, functions and performance of the two-wire electronic temperature switch described above. Incorporation of the two wire electronic temperature switch elements into the MEMS device provides for circuit features and component structures that may be unavailable with off the shelf electronic components and may provide for higher precision, lower power consumption, reduction of EMI effects and reduction in effects of single event upset (e.g., ionizing radiation and the like).

In one embodiment, the integrated MEMS device 200 may include fabricated elements such as transistors, amplifiers, precision voltage references (such as Band Gap devices), matched current sources and current mirrors, and temperature sensing elements such as junction temperature sensors, temperature variable resistors, and thermo-voltaic temperature sensors. These elements incorporated into the miniature MEMS device may offer an enhanced sensitivity and response time due to the miniaturized size and low thermal mass. The small cross sectional area of the MEMS device may also reduce effects of neutron and ionizing radiation as a result of the smaller cross-sectional area of the MEMS device. The MEMS devices may also allow for more efficient packaging, such as embedding the MEMS within small tubes, placement of the MEMS on conformal surfaces, and integration of the MEMS into existing components, such as pumps, piping, airfoils, flow meters, controls and any location where small physical size is an advantage to the application.

In one embodiment, the MEMS device 200 shown in FIG. 6, may comprise an integrated circuit (IC) fabricated from a common substrate. In one embodiment, the substrate is silicon. In one embodiment, the MEMS device 200 has a small form factor. In one embodiment, the MEMS device may have dimensions of approximately 3 mm by 5 mm. In another embodiment, the MEMS device may have slightly larger dimensions. In another embodiment, the MEMS device may have slightly smaller dimensions. The MEMS device 200 may include an electronic temperature switch, such as electronic temperature switch 210 described above. The electronic temperature switch 210 may be on a single chip 223 integrated in the MEMS device 200. In one embodiment, the MEMS device 200 may disposed within the RTD 54 of FIGS. 5A and 5B.

In one embodiment, the chip 223 may be wire bonded to an external package or carrier, such as a ceramic hybrid or printed circuit board. More specifically, a pair of wire bond pads 225, 226 may connect between the integrated MEMS chip 223 via wires 227 to an external device, such as the wire pads 225, 226. In one embodiment, the wire bond pads 225, 226 may have a copper layer in contact with the MEMS substrate, a nickel layer in contact with the copper, and a gold top layer. In an alternate embodiment, the copper may be replaced with aluminum.

In another embodiment, solder (or gold) bump structures may be located between the chip 223 and the MEMS substrate. In another embodiment, a deep reactive Ion Etch DRIE filled with gold or solder may connect the bottom of the chip 223 with the MEMS substrate.

In yet another embodiment, a three-dimensional metal may plate the surfaces of the MEMS device 200 with traces having a wire pad or a solder (or gold) bump on a side of the chip 223 or on the bottom of the chip 223.

The MEMS device may include a temperature sensor 214. In one embodiment, the temperature sensor 214 may be a variable resistance temperature sensor, and may be disposed proximal to the electronic temperature switch electronics 210. In one embodiment, the temperature sensor 214 may be connected to the electronic temperature switch electronics via wires 222. In another embodiment, a transistor or diode junction may be used instead of the temperature sensor 214, which changes the voltage drop across the junction as the temperature changes. The MEMS 200 may further include wire pads that interconnect with the electronic temperature switch electronics 210. [0123] The electronic temperature switch 210 of chip 223 integrated into the MEMS substrate may include a measurement circuit 211 that measures temperature and generates a temperature signal corresponding to the sensed temperature. The MEMS device 200 functions as a 2-wire electronic sense circuit providing both an indication state and deriving power from an external two-wire sense circuit 220. The chip 223 may further include an evaluator circuit 212 that receives said temperature signal from the electronic temperature switch 210 and compares said temperature signal to a lower threshold value and an upper threshold value, and generates an evaluation signal indicating when said temperature signal is between the lower temperature threshold value and an higher temperature threshold value.

In one embodiment, the evaluator circuit 212 may have an evaluation circuit ratio independent of power supply voltage. In one embodiment, the measurement circuit 211 may comprise an enhancement circuit 213 that enhances signal-to-noise-ratio of the temperature signal for input to the evaluator circuit 212. The switch 210 may derive essentially all operating power from a 2-wire sense circuit 220 in some embodiments. In additional electronic temperature switch embodiments, the electronic temperature switch 210 may comprise a 2-wire device 220 powered by a power supply with a series resistance, where the evaluation signal indication is at the junction of the series resistor and the power supply input. In some embodiments, there may be a connection through wire bond pads 225, 226 to an external 2-wire sense circuit 220 such that the electronic temperature switch 210 derives power from the two-wire sense circuit 220.

In one embodiment, the evaluator circuit 212 may comprise a window comparator circuit 215, where the comparator window circuit 215 may be configured for comparing the temperature signal to a lower reference value corresponding to the lower temperature threshold value, and comparing the temperature signal to a higher reference value corresponding to the higher temperature threshold value. In one embodiment, the window comparator 215 indicates when the temperature signal is between the lower temperature threshold value and a higher temperature threshold value.

In one embodiment, the window comparator 215 circuit may include a first comparator 216 for comparing the temperature signal to the lower reference value corresponding to the lower temperature threshold value, and a second comparator 217 for comparing the temperature signal to the higher reference value corresponding to the higher temperature threshold value.

In one embodiment, comparator accuracy may be improved by amplifying the generated temperature signal via an amplifier 218 to improve a signal to noise ratio of the generated temperature signal. In one embodiment, the MEMS device 200 may also include a loading circuit 219 that, in response to an on/off condition of the evaluator circuit 212, connects or disconnects the load to increase or respectively decrease the current draw. The loading circuit 212 generates a first pre-set output signal indicating when the temperature signal is between the lower threshold value and the higher threshold value, and a second pre-set output signal when the temperature signal is not between the lower threshold value and the higher threshold value. In one embodiment, turning on the indication turns on the load, thereby increasing the current draw. Turning off the indication signal disconnects the load, thereby reducing current draw. In one embodiment, the current passes through a sense resistor, such as sense resistor 5 of FIG. 1. In one embodiment, the MEMS device 200 may include a protection circuit 233 that provides over-voltage protection.

In one embodiment, the MEMS device 200 may be placed in a housing. In another embodiment, the MEMS device 200 may include a housing for housing the electronic temperature switch circuit 210 and at least a portion of the temperature sensor. In another embodiment, the housing may house just the microelectronic temperature switch circuit. In one embodiment, the MEMS device 200 may be mounted in a thermowell type enclosure that encloses the MEMS device 200.

In one embodiment, the MEMS device 200 may derive essentially all operating power from a 2-wire sense circuit 220. In additional MEMS device embodiments, the MEMS device may have dimensions of approximately 3 millimeters by 5 millimeters. In additional embodiments, the MEMS device 200 may include at least one transistor, at least one amplifier, precision voltage references, matched current sources and current mirrors, and temperature sensing elements, such as junction temperature sensors, temperature variable resistors, and thermo-voltaic temperature sensors.

Figure 8:
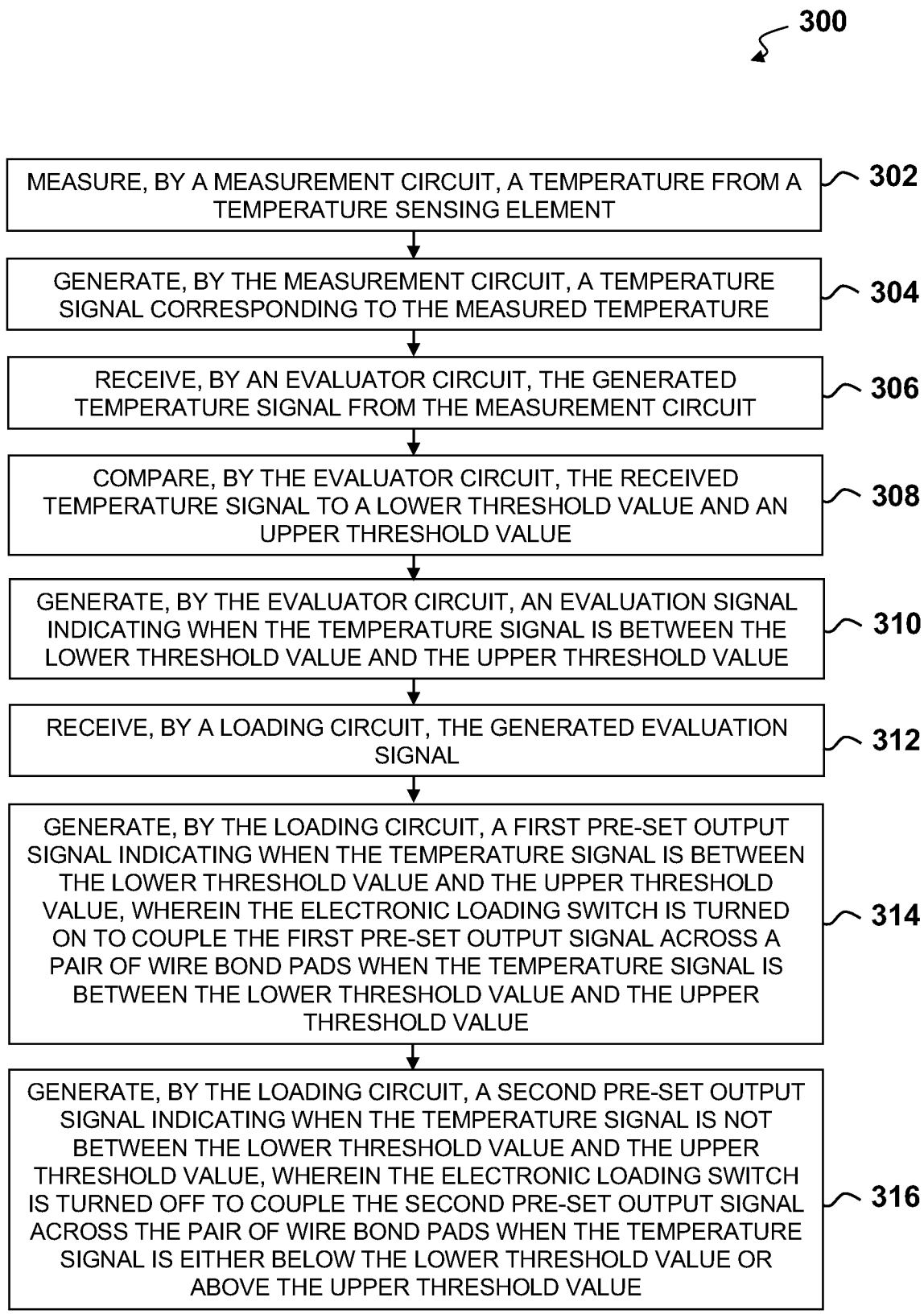
FIG. 8 depicts a high-level flowchart of an embodiment of a method of electronic temperature measurement and switching disclosed herein, such as may be implemented by an embodiment of a embodiment of a Micro Electro-Mechanical System (MEMS) device that may functions as a 2-wire electronic sense circuit, according to one embodiment.

FIG. 8 depicts a high-level flowchart of a method embodiment 300 of a Micro Electro-Mechanical System (MEMS) device that functions as a 2-wire electronic sense circuit, according to one embodiment. The MEMS device functions as a 2-wire electronic sense circuit providing both an indication state and deriving power from an external two-wire sense circuit 220. The method 300 may include measuring, by a measurement circuit (211, FIG. 7B), a temperature from a temperature sensing element (214, FIG. 7B) (step 302). The method may also include generating, by the measurement circuit (211, FIG. 7B), a temperature signal corresponding to the measured temperature (step 304). The method 300 may also include receiving, by an evaluator circuit (212, FIG. 7B), the generated temperature signal from the measurement circuit (211, FIG. 7B) (step 306). The method 300 may also include comparing, by the evaluator circuit (212, FIG. 7B), the received temperature signal to a lower threshold value and an upper threshold value (step 308). The method 300 may also include generating, by the evaluator circuit (212, FIG. 7B), an evaluation signal indicating when the temperature signal is between the lower threshold value and the upper threshold value (step 310). The method 300 may also include receiving, by a loading circuit (219, FIG. 7B), the generated evaluation signal (step 312). The method 300 may also include generating, by the loading circuit (219, FIG. 7B), a first pre-set output signal indicating when the temperature signal is between the lower threshold value and the upper threshold value, where the electronic loading switch is turned on to couple the first pre-set output signal across a pair of wire bond pads when the temperature signal is between the lower threshold value and the upper threshold value (step 312). The method 300 may also include generating, by the loading circuit (219, FIG. 7B), a second pre-set output signal indicating when the temperature signal is not between the lower threshold value and the upper threshold value, where the electronic loading switch is turned off to couple the second pre-set output signal across the pair of wire bond pads when the temperature signal is either below the lower threshold value or above the upper threshold value (step 314).

Those skilled in the art will appreciate that various adaptations and modifications of the described preferred embodiments can be configured without departing from the scope and spirit of the electronic temperature switch device and circuit described herein. Therefore, it is to be understood that, within the scope of the embodiments, the electronic temperature switch device may be practiced other than as specifically described herein.

What is claimed is:

1. A Micro Electro-Mechanical System (MEMS) device comprising:
an evaluator circuit that receives a temperature signal, wherein the evaluator circuit compares the received temperature signal to a lower threshold value and an upper threshold value, and wherein the evaluator circuit generates an evaluation signal indicating when the temperature signal is between the lower threshold value and the upper threshold value; and
a loading circuit that receives the evaluation signal, wherein the loading circuit generates a first pre-set output signal indicating when the temperature signal is between the lower threshold value and the upper threshold value, and wherein the loading circuit generates a second pre-set output signal when the temperature signal is not between the lower threshold value and the upper threshold value, such that the MEMS device functions as a 2-wire electronic sense circuit providing both an indication state and deriving power from an external two-wire sense circuit.

2. The MEMS device of claim 1, further comprising:
an electronic temperature switch; and
a pair of wire bond pads;
wherein the electronic loading switch is turned on to couple the first pre-set output signal across the pair of wire bond pads when the temperature signal is between the lower threshold value and the upper threshold value; and
wherein the electronic loading switch is turned off to couple the second pre-set output signal across the pair of wire bond pads when the temperature signal is either below the lower threshold value or above the upper threshold value.

3. The MEMS device of claim 2 wherein the electronic temperature switch is disposed on a single chip integrated in the MEMS device, and wherein the electronic temperature switch is connected to the pair of wire bond pads via corresponding wires.

4. The MEMS device of claim 3, wherein the electronic temperature switch is integrated into a MEMS substrate.

5. The MEMS device of claim 3, further comprising:
a temperature sensing element, wherein the electronic temperature switch is connected to the temperature sensing element via at least one wire.

6. The MEMS device of claim 5, further comprising:
a measurement circuit that measures a temperature from the temperature sensing element, wherein the measurement circuit generates the temperature signal corresponding to the measured temperature.

7. The MEMS device of claim 6, further comprising:
an enhancement circuit of the measurement circuit, wherein the enhancement circuit enhances a signal-to-noise ratio of the temperature signal prior to generation of the temperature signal.

8. The MEMS device of claim 3, further comprising:
a connection through wire bond pads to the external two-wire sense circuit, wherein the electronic temperature switch derives power from the external two-wire sense circuit.

9. The MEMS device of claim 2, further comprising:
a window comparator circuit of the evaluator circuit, wherein the window comparator circuit compares the temperature signal to a lower reference value corresponding to the lower temperature threshold value, and wherein the window comparator circuit compares the temperature signal to the higher reference value corresponding to the higher temperature threshold value, and wherein the window comparator circuit indicates when the temperature signal is between the lower temperature threshold value and the higher temperature threshold value.

10. The MEMS device of claim 9, further comprising:
a first comparator of the window comparator circuit, wherein the first comparator compares the temperature signal to the lower reference value corresponding to the lower temperature threshold value.

11. The MEMS device of claim 10, further comprising:
a second comparator of the window comparator circuit, wherein the second comparator compares the temperature signal to the higher reference value corresponding to the lower temperature threshold value.

12. The MEMS device of claim 11, further comprising:
an amplifier of the window comparator circuit, wherein the amplifier improves a signal-to-noise ratio of the generated temperature signal.

13. The MEMS device of claim 2, wherein the MEMS device is incorporated within a single integrated MEMS consisting of a small form factor.

14. The MEMS device of claim 13, wherein the small form factor is 3 millimeters by 5 millimeters.

15. The MEMS device of claim 2, further comprising:
a protection circuit connected between the pair of wire bond pads, wherein the protection circuit provides over-voltage protection.

16. A method comprising:
measuring, by a measurement circuit, a temperature from a temperature sensing element;
generating, by the measurement circuit, a temperature signal corresponding to the measured temperature;
receiving, by an evaluator circuit, the generated temperature signal from the measurement circuit;
comparing, by the evaluator circuit, the received temperature signal to a lower threshold value and an upper threshold value;
generating, by the evaluator circuit, an evaluation signal indicating when the temperature signal is between the lower threshold value and the upper threshold value;
receiving, by a loading circuit, the generated evaluation signal;
generating, by the loading circuit, a first pre-set output signal indicating when the temperature signal is between the lower threshold value and the upper threshold value, wherein the electronic loading switch is turned on to couple the first pre-set output signal across a pair of wire bond pads when the temperature signal is between the lower threshold value and the upper threshold value; and
generating, by the loading circuit, a second pre-set output signal indicating when the temperature signal is not between the lower threshold value and the upper threshold value, wherein the electronic loading switch is turned off to couple the second pre-set output signal across the pair of wire bond pads when the temperature signal is either below the lower threshold value or above the upper threshold value.

* * * * *